(12) United States Patent
Oetiker et al.

(10) Patent No.: US 10,830,837 B2
(45) Date of Patent: Nov. 10, 2020

(54) MAGNETIC ADHESIVE FORCE MONITORING SYSTEM FOR MAGNETIC WHEELED ROBOT

(71) Applicant: General Electric Company, Schenectady, NY (US)

(72) Inventors: Moritz Benjamin Oetiker, Zurich (CH); Markus Wiesendanger, Zurich (CH); Walter Baur, Eglisau (CH); Hans Wyder, Forch (CH)

(73) Assignee: General Electric Company, Schenectady, NY (US)

( * ) Notice: Subject to any disclaimer, the term of this patent is extended or adjusted under 35 U.S.C. 154(b) by 148 days.

(21) Appl. No.: 16/172,079

(22) Filed: Oct. 26, 2018

(65) Prior Publication Data

US 2020/0132784 A1  Apr. 30, 2020

(51) Int. Cl.
*G01R 33/02* (2006.01)
*B60B 19/00* (2006.01)
*G05D 1/02* (2020.01)

(52) U.S. Cl.
CPC ............ *G01R 33/02* (2013.01); *B60B 19/006* (2013.01); *G05D 1/021* (2013.01); *G05D 2201/0207* (2013.01)

(58) Field of Classification Search
None
See application file for complete search history.

(56) References Cited

U.S. PATENT DOCUMENTS

| | | |
|---|---|---|
| 2,581,394 A | 1/1952 | Dinger |
| 4,553,095 A | 11/1985 | Schenk, Jr. et al. |
| 9,678,175 B2 | 6/2017 | Tiernan et al. |
| 2014/0230711 A1 | 8/2014 | Lovelace et al. |
| 2017/0036349 A1 | 2/2017 | Cherney et al. |

(Continued)

FOREIGN PATENT DOCUMENTS

| | | | |
|---|---|---|---|
| EP | 3067258 A1 | 9/2016 | |
| KR | 20130132834 A | 12/2013 | |
| KR | 20130134834 | * | 4/2014 |

OTHER PUBLICATIONS

"PosiTector 6000 Series, Coating Thickness Gages for All Metal Substrates", www.defelsko.com/positector-6000, 2018, 4 pages, USA.

(Continued)

*Primary Examiner* — Tamara L Weber
(74) *Attorney, Agent, or Firm* — James Pemrick; Hoffman Warnick LLC

(57) ABSTRACT

A magnetic adhesive force monitoring system, magnetic wheeled robot and related method are disclosed. The system includes a magnetic field sensor measuring a stray field portion of a total magnetic field emitted by a magnetic wheel that is magnetically adhered to a ferromagnetic structure, the stray field portion including a portion of the total magnetic field redirected by the ferromagnetic structure. A controller determines a change in a magnetic adhesion force of the magnetic wheel to the ferromagnetic structure based on a change in the measured stray field portion of the total magnetic field. Embodiments also provide for determination of a contact point of the wheel with a ferromagnetic structure.

19 Claims, 7 Drawing Sheets

(56) References Cited

U.S. PATENT DOCUMENTS

2020/0094618 A1* 3/2020 La .................. B60C 19/00

OTHER PUBLICATIONS

European Search Report for European application No. EP19205217.3 dated Apr. 1, 2020, 42 pgs.
Espinoza Rodrigo Valerio et al: "Navigation's Stabilization System of a Maginetic Adherence-Based Climbing R", Journal of Intelligent and Robotic Systems, Kluwer Dordrecht, NL, vol. 78, No. 1, Jul. 5, 2014 (Jul. 5, 2014), pp. 65-81.
Kawaguchi Y et al: "Sensors and crabbing for an in-pipe magnetic-wheeled robot", Advanced Intelligent Mechatronics '97. Final Program and Abstracts., I EEE/ASME International Conference on Tokyo, Japan Jun. 16-20, 1997, New York, NY, USA,IEEE, US,Jun. 16, 1997 (Jun. 16, 1997), p. 119.
Rui Wang et al: "A magnetic climbing robot for steel bridge inspection", Proceeding of the 11th World Congress on Intelligent Control and Automation, IEEE, Jun. 29, 2014 (Jun. 29, 2014), pp. 3303-3308.
Hirose S et al: "Disk Rover: A Wall-climbing Robot Using Permanent", Proceedings of the IEEE/RSJ International Conference on Intelligent Robots and Systems. Raleigh, NC., Jul. 7-10, 1992; [Proceedings of the IEEE/RSJ International Conference on Intelligent Robots and Systems], New York, IEEE, US, vol. 3, Jul. 7, 1992 (Jul. 7, 1992), pp. 2074-2079.

\* cited by examiner

MAGNETIC ADHESIVE FORCE MONITORING SYSTEM FOR MAGNETIC WHEELED ROBOT

BACKGROUND OF THE INVENTION

The disclosure relates generally to magnetic wheeled robots, and more particularly, to a magnetic adhesive force monitoring for such robots, and a related method.

Magnetic wheeled robots are used in a variety of industrial settings for inspection of ferromagnetic structures. These robots use magnetic wheels for surface adhesion to the ferromagnetic structures. During their movement, inspection processes are carried out such as visual inspection, ultrasonic inspection, or inductive current testing, etc. Variations in magnetic force can heighten the possibility that the robots lose contact with the ferromagnetic structure. Variations in the magnetic force can be caused by a number of factors such as a thickness change of a non-magnetic coating, e.g., on the ferromagnetic structure; obstacles like welds or corners; presence of non-ferromagnetic material, e.g., austenitic welds or glass/epoxy repair patches; and/or changes of the underlying ferromagnetic material, e.g., a thinner region therein.

Typically, magnetic wheeled robots are not provided with any form of adhesion force measurement. However, one advantage of magnetic wheeled robots is that they can be employed in non-horizontal configurations, e.g., on a vertically oriented structure, and upside down. One risk of use in this setting is that they can fall if the robot loses magnetic adhesion with the underlying ferromagnetic structure. One approach to address this situation with current robots is to always employ a safety line to catch the robot if it falls. However, this approach requires extensive amounts of effort and time to install the safety line prior to use of the robots.

Another approach is to always use very strong magnets to ensure a large safety margin. However, strong magnets typically mean more weight, size and complexity than actually needed, and with little additional safety but more cost. In terms of complexity, the stronger magnets must be configured in a spaced arrangement from the internal surface of the wheel, which increases the spacing from the magnets and the ferromagnetic structure, intrinsically reducing magnetic force.

Where magnetic force sensors are used to determine when magnetic adhesion may be reduced or lost, they are located inside the wheels to allow measurement of the magnetic field entering the ferromagnetic structure. This approach can only be used on larger wheeled robots (e.g., 30 centimeter wheel-diameter) because the sensors require sufficient space for mounting inside the wheels. In addition, the complicated power and signal connections inside the wheel prohibit use on smaller wheels. The magnetic force sensors inside the wheel can also disturb and/or reduce the magnetic adhesion, reducing the performance of the magnetic wheel. Since larger wheels are required, the range of applications for which such robots can be employed has been limited.

Another approach employs an inductive current measurement system on the robots to measure coating thickness and material properties of the ferromagnetic structure for magnetic adhesion force reducing situations. The measurement systems must be guided in close contact over the surface. Integration of such systems with the robot is difficult and usually only makes financial sense if the inductive current measurement system is also used as part of the inspection system for the ferromagnetic structure.

BRIEF DESCRIPTION OF THE INVENTION

A first aspect of the disclosure provides a magnetic adhesion force monitoring system, comprising: a magnetic field sensor measuring a stray field portion of a total magnetic field emitted by a magnetic wheel that is magnetically adhered to a ferromagnetic structure, the stray field portion including a portion of the total magnetic field redirected by the ferromagnetic structure; and a controller determining a change in a magnetic adhesion force of the magnetic wheel to the ferromagnetic structure based on a change in the measured stray field portion of the total magnetic field.

A second aspect of the disclosure provides a magnetic crawler robot, comprising: a chassis having a plurality of magnetic wheels thereon, each magnetic wheel configured to magnetically adhere the chassis to a ferromagnetic structure; a magnetic field sensor measuring a stray field portion of a total magnetic field emitted by at least one selected magnetic wheel, the stray field portion including a portion of the total magnetic field redirected by the ferromagnetic structure; and a controller determining a change in a magnetic adhesion force of the magnetic wheel to the ferromagnetic structure based on a change in the measured stray field portion of the total magnetic field.

A third aspect of the disclosure provides a method, comprising: measuring a stray field portion of a total magnetic field emitted by a magnetic wheel while the magnetic wheel is magnetically adhered to a ferromagnetic structure, the stray field portion including a portion of the total magnetic field redirected by the ferromagnetic structure; and identifying a change in a magnetic adhesion force of the magnetic wheel to the ferromagnetic structure based on a change in the measured stray field portion of the total magnetic field.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION OF THE INVENTION

Figure 1:
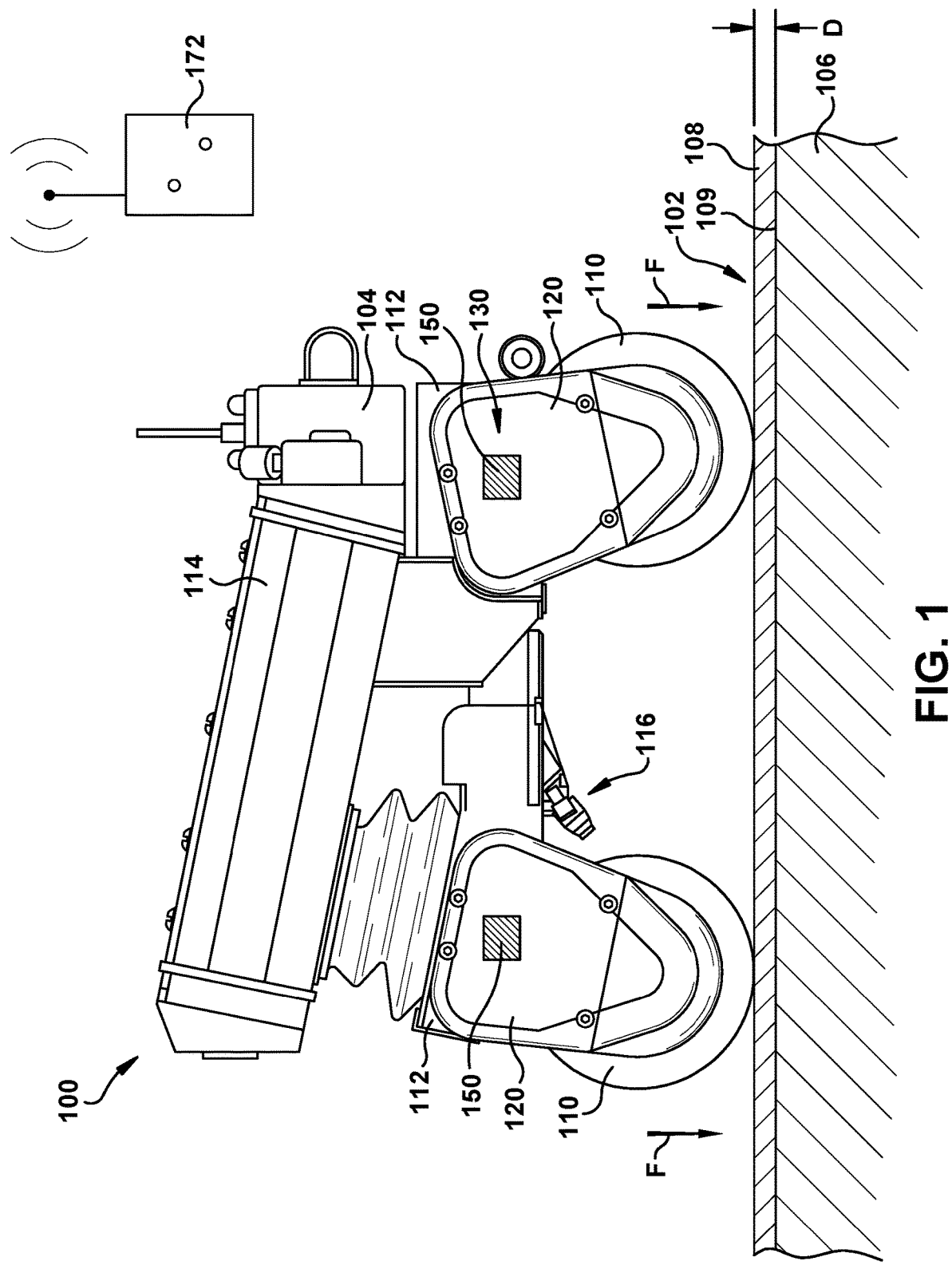
FIG. 1 shows a side view of an illustrative magnetic wheeled robot including a magnetic force monitoring system according to embodiments of the disclosure.

As an initial matter, in order to clearly describe the current disclosure it will become necessary to select certain terminology when referring to and describing relevant machine components within a magnetic wheeled robot. When doing this, if possible, common industry terminology will be used and employed in a manner consistent with its accepted meaning. Unless otherwise stated, such terminology should be given a broad interpretation consistent with the context of the present application and the scope of the appended claims. Those of ordinary skill in the art will appreciate that often a particular component may be referred to using several different or overlapping terms. What may be described herein as being a single part may include and be referenced in another context as consisting of multiple components. Alternatively, what may be described herein as including multiple components may be referred to elsewhere as a single part.

In addition, several descriptive terms may be used regularly herein, and it should prove helpful to define these terms at the onset of this section. These terms and their definitions, unless stated otherwise, are as follows. The terms "forward" and "aft," without any further specificity, refer to directions, with "forward" referring to the front end of the robot, and "aft" referring to the rearward end of the robot. It is often required to describe parts that are at differing radial positions with regard to a center axis, e.g., of a magnetic wheel. The term "radial" refers to movement or position perpendicular to an axis. In cases such as this, if a first component resides closer to the axis than a second component, it will be stated herein that the first component is "radially inward" or "inboard" of the second component. If, on the other hand, the first component resides further from the axis than the second component, it may be stated herein that the first component is "radially outward" or "outboard" of the second component. The term "axial" refers to movement or position parallel to an axis. Finally, the term "circumferential" refers to movement or position around an axis. It will be appreciated that such terms may be applied in relation to the center axis of the magnetic wheel.

Where an element or layer is referred to as being "on," "engaged to," "disengaged from," "connected to" or "coupled to" another element or layer, it may be directly on, engaged, connected or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

As indicated above, the disclosure provides a magnetic adhesive force monitoring system, magnetic wheeled robot and related method. The system includes a magnetic field sensor measuring a stray field portion of a total magnetic field emitted by a magnetic wheel such as a magnetic wheel that is magnetically adhered to a ferromagnetic structure. The stray field portion includes a portion of the total magnetic field not attracted by the ferromagnetic structure, i.e., not used to adhere the wheel to the ferromagnetic structure. A controller determines a change in a magnetic adhesion force of the magnetic wheel to the ferromagnetic structure based on a change in the measured stray field portion of the total magnetic field. Use of two magnetic field sensors allows for determination of a contact point of the wheel with the ferromagnetic structure. Additional features and advantages will be described herein.

FIG. 1 shows a side view of an illustrative magnetic wheeled robot 100, also referred to as a magnetic crawler robot. Magnetic wheeled robot 100 (hereinafter "robot 100") may include any now known or later developed robotic system employing magnetic adhesion to a ferromagnetic structure 102 over which it moves. While the teachings are described relative to a magnetic wheel, it is appreciated that the disclosure can be applied to other motive configurations, e.g., tracks. Ferromagnetic structure 102 may include any now known or later developed ferromagnetic body 106 made of ferromagnetic material such as but not limited to: pure or alloy versions of iron (e.g., steel), or nickel or cobalt (e.g., some superalloys), or some rare earth metals. In addition, in some cases, shown in for example FIGS. 1 and 5, ferromagnetic structure 102 may also include a coating 108, i.e., of any non-ferromagnetic material such as but not limited to a protective coating or sealing coating like: paint; polymer; thermal barrier coatings; metal coating like stainless steel coatings; glass coatings; epoxy; and/or glass fiber, etc. Coating 108 creates a standoff distance D from a surface 109 of ferromagnetic body 106, e.g., of 0.1 to 8.0 millimeters (mm). In other cases, shown in FIG. 4, ferromagnetic body 106 may not include a coating, i.e., standoff distance D is zero. In any event, ferromagnetic body 106 may have any thickness, e.g., 0.5 millimeters (mm) to 150 mm.

Continuing with FIG. 1, robot 100 may include a chassis 104 upon which other structure is mounted. While shown as a unitary body, it is understood that chassis 104 may include a number of parts, perhaps coupled through rotating joints. Magnetic wheels 110 may be rotatably coupled to chassis 104. That is, chassis 104 may have a plurality of magnetic wheels 110 thereon, each magnetic wheel 110 configured to magnetically adhere the chassis to ferromagnetic structure 102. Robot 100 may include any number of magnetic wheels 110 necessary to support it, and may also include non-magnetic wheels (not shown). Robot 100 includes at least one motor 112 (see also FIG. 2) configured to drive at least one of the magnetic wheel(s) 110. Motor(s) 112 may drive magnetic wheel(s) 110 in any now known or later developed manner, e.g., by direct connection to an axle 113 (FIGS. 2, 3 and 8) thereof, or using any form of power transmission like gears, belts, chains, etc. A motor controller 114 may be provided to control of operation of motor(s) 112, e.g., direction, speed, acceleration, stopping, power, etc. Motor controller 114 may include any now known or later developed control system for motor(s) 112 that is pre-programmed and/or remote controlled to drive magnetic wheel(s) 110, e.g., an embedded computer, microcontrollers, Arduino controller, or any other form of computer control, etc. Robot 100 may also be devoid of a motor controller (as in FIG. 3) where manual motive power is imparted to robot 100 through, for example, single use pneumatic power, a push rod, a cable/rope, etc. Robot 100 may also include any now known or later developed inspection system 116 such as but not limited to: inductive current inspection systems, ultrasonic inspection systems, surface profiling systems, video inspection systems, X-ray systems, and/or magnetic resonance imaging (MRI) systems. Each magnetic wheel 110 may include a protective fender 120 that creates a wheel well over the wheel.

Figure 2:
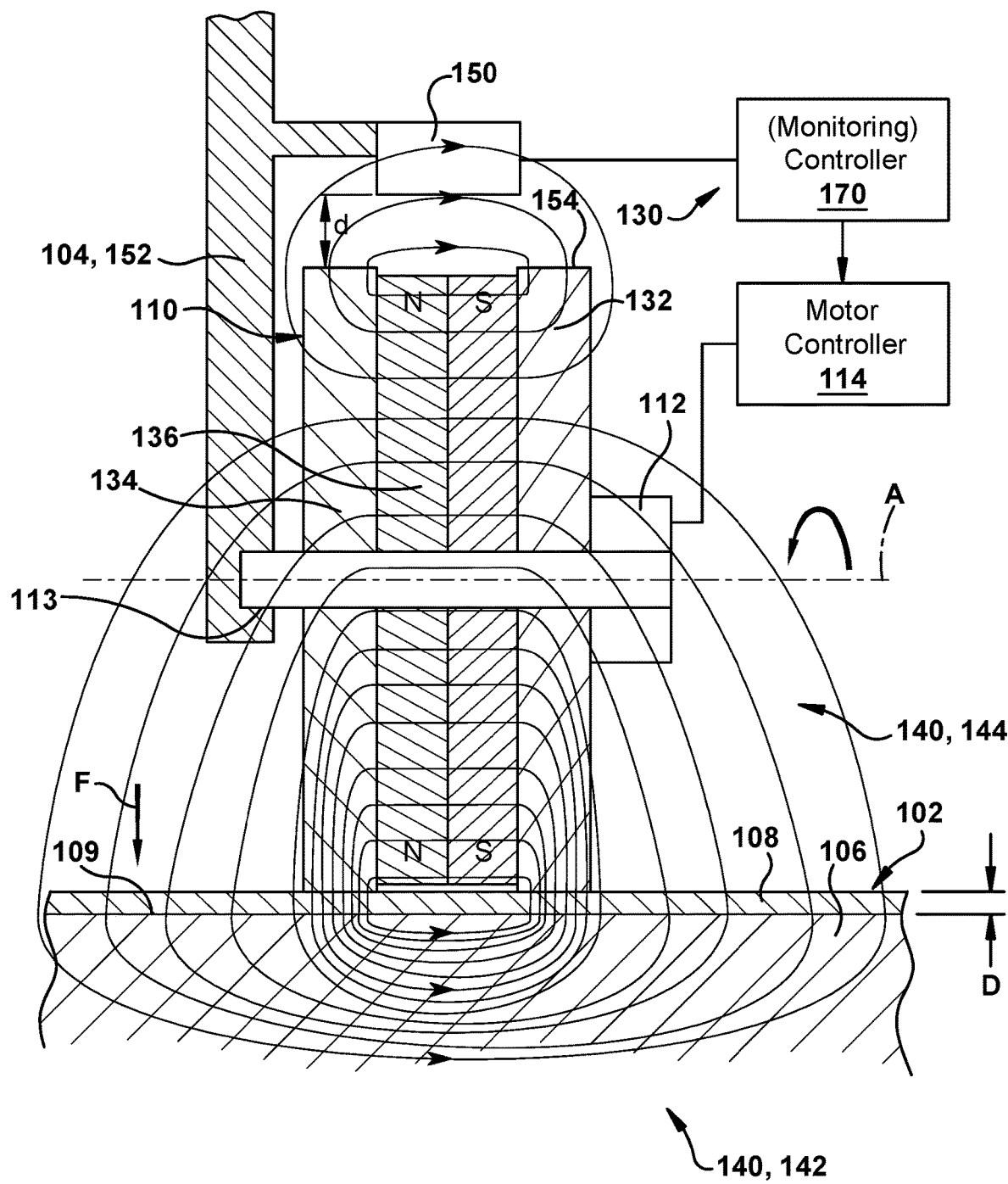
FIG. 2 is a front, cross-sectional view of a magnetic wheel with a magnetic field sensor of a monitoring system according to embodiments of the disclosure.
Figure 3:
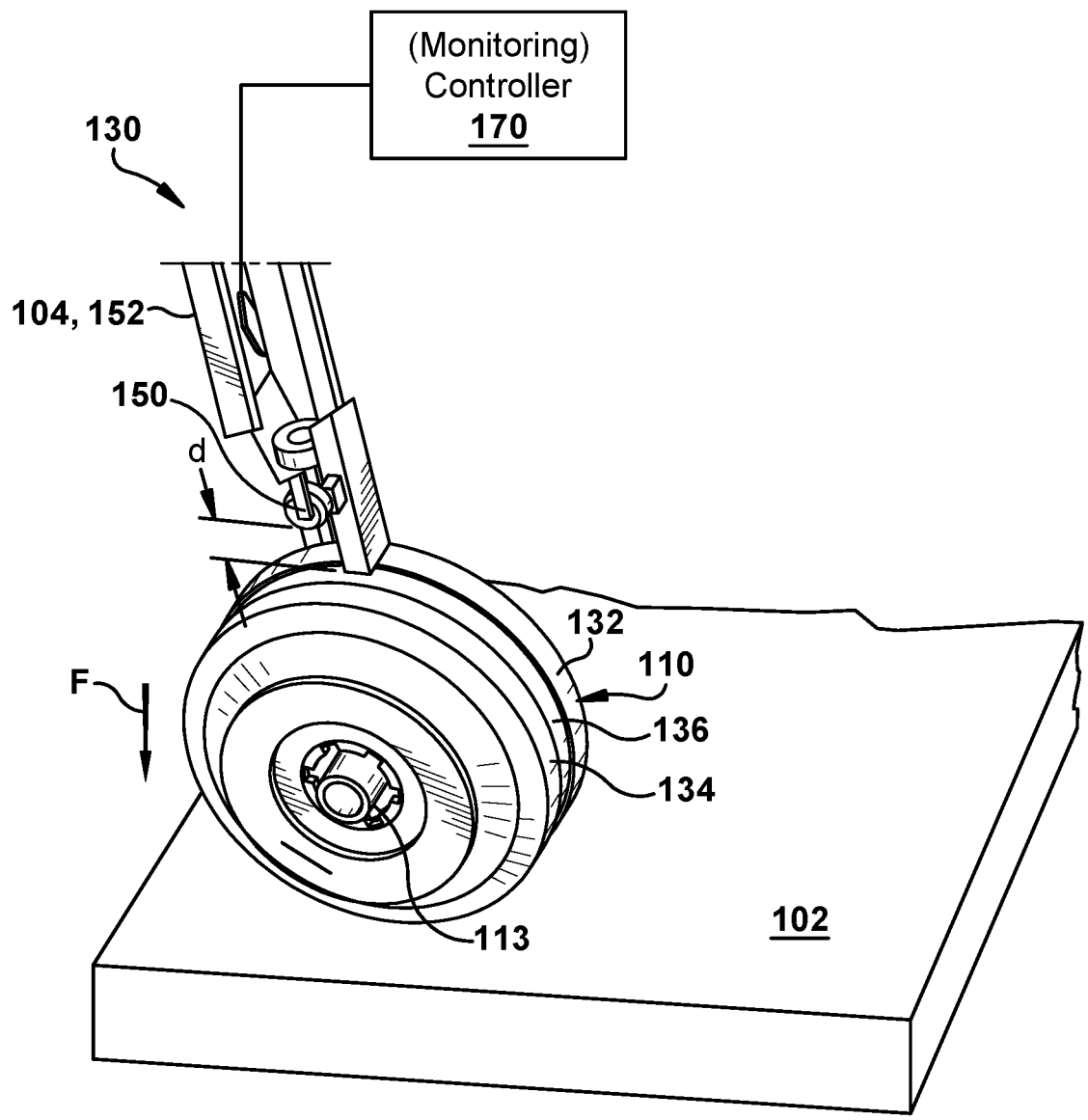
FIG. 3 shows a perspective view a magnetic wheel with a magnetic field sensor of a monitoring system according to embodiments of the disclosure.
Figure 4:
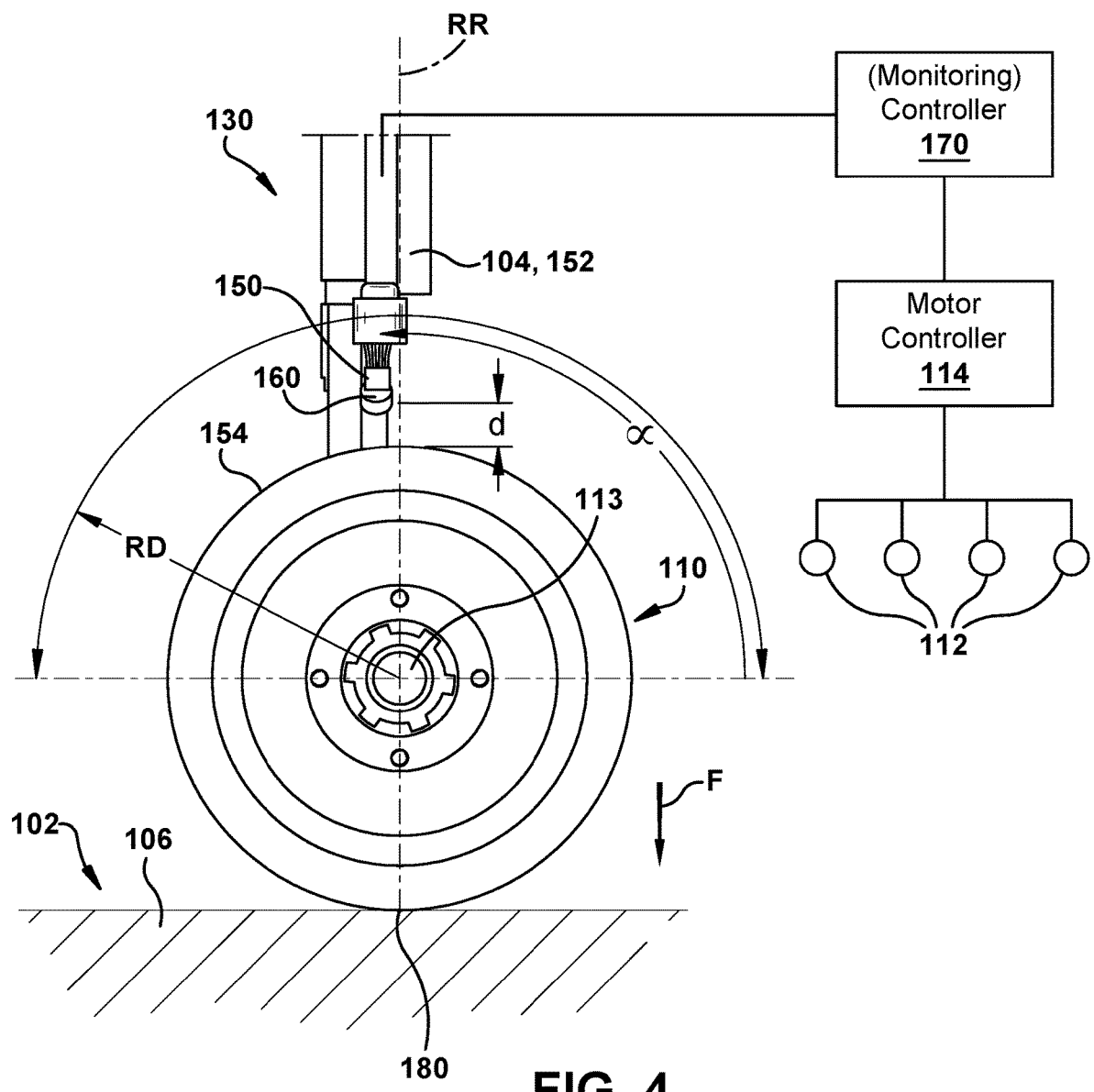
FIG. 4 shows a side view of a magnetic wheel with a magnetic field sensor of a monitoring system according to embodiments of the disclosure.

Robot 100 may also include a magnetic adhesion monitoring system 130 according to embodiments of the disclosure. FIGS. 2-4 show various views of magnetic adhesion monitoring system 130 (hereinafter "monitoring system 130") and magnetic wheel 110. FIG. 2 shows a front, cross-sectional view through magnetic wheel 110; FIG. 3 shows a perspective view with protective fender 120 (FIG. 1) and other structure removed; and FIG. 4 shows a side view with protective fender 120 (FIG. 1) and other structure removed.

As shown in FIGS. 2 and 3, magnetic wheel 110 may include a number of circular disks 132, 134, 136 that collectively create the wheel. Outer disks 132, 134 may include a metal or metal alloy through which a (total) magnetic field 140 may be emitted from an internal magnetic disk 136 positioned between outer disks 132, 134. Internal magnetic disk 136 may include any magnetic material capable of creating magnetic field 140 therefrom, i.e., with north and south poles perhaps arranged as indicated. Ideally, internal magnetic disk 136 is configured to have sufficient magnetic flux density strength, i.e., Tesla or Gauss (1 T=10,0000 G), to either alone or in combination with other internal magnetic disks maintain magnetic adhesion of magnetic wheel(s) 110 with ferromagnetic structure 102. The strength of a magnetic adhesion force F for a particular ferromagnetic structure 102 may vary depending on a number of factors including the strength of the magnet(s) employed, the dimensions of magnetic wheel 110, and the standoff distance D created either by a coating 108 on surface 109 of ferromagnetic structure 102 or on magnetic wheel 110 (latter not shown). There is a relation between the standoff distance D, created by coating 108, and the resulting magnetic adhesion force F generated by a magnetic wheel 110. Knowing standoff distance D, a model of magnetic adhesion force F versus measured magnetic flux of stray field portion 144 by magnetic field sensor(s) 150 can be formulated for each standoff distance D that can be used to determine magnetic adhesion force F. The total adhesion force necessary to hold robot 100 to a ferromagnetic structure 102 may depend on, for example: the type and thickness of ferromagnetic structure 102, the weight of robot 100, expected vertical orientation of robot 100, environmental conditions (e.g., precipitation, wind, temperature, etc.), and/or ferromagnetic structure 102 surface conditions.

Magnetic wheel 110 emits magnetic field 140 therefrom to magnetically adhere the wheel, and consequently the rest of robot 100, to ferromagnetic structure 102. Typically, when not in a vicinity of ferromagnetic structure 102, magnetic field 140 extends cross-sectionally symmetrical from circumference of magnetic wheel 110. In contrast, as shown in FIG. 2, when near or contacting ferromagnetic structure 102, an adhering field portion 142 of total magnetic field 140 interacts with ferromagnetic structure 102 to adhere the wheel thereto, and another, stray field portion 144 of total magnetic field 140 is not attracted by ferromagnetic structure 102. (In FIG. 2, the magnetic field 140 extending from the upper cross-section of magnetic wheel 110 is not shown, for clarity). As used herein, "stray field portion" 144 may include any portion of total magnetic field 140 that is not attracted by ferromagnetic structure 102. The stray field portion may also include other magnetic field portions from other magnets in the vicinity—such field portions would be addressed as sources of disturbance, bias or noise on the actual measurement, i.e., they would be ignored or removed, allowing measurement of the more dominant magnetic field generated by magnetic wheel 110 over which magnetic field sensors 150 are mounted. Stray field portion 144 is typically significantly less powerful than adhering field portion 142.

Monitoring system 130 includes one or more magnetic field sensors 150 for measuring a magnetic flux density of stray field portion 144, e.g., by presenting an electrical signal (voltage, current or other digital signal) relatable to magnetic flux density (measured in Gauss or Tesla). Each magnetic field sensor 150 may include any now known or later developed sensor for measuring a magnetic flux density such as but not limited to: a Hall Effect element or a conductive coil. As noted, stray field portion 144 includes a portion of total magnetic field 140 not attracted by ferromagnetic structure 102. Where robot 100 includes a plurality of magnetic wheels 110, each magnetic wheel 110 may include at least one magnetic field sensor 150 positioned thereabout (see FIG. 1) to measure stray field portion 144 (FIG. 2) of total magnetic field 140 about the respective magnetic wheel that is redirected by ferromagnetic structure 102. In this fashion, as will be described, a magnetic adhesion force F (e.g., in Newtons) of each magnetic wheel 110 having a magnetic field sensor 150 can be monitored.

Magnetic field sensor(s) 150 may be mounted relative to a respective magnetic wheel 110 in any now known or later developed fashion, e.g., to protect it from damage. In FIG. 1, magnetic field sensor(s) 150 are mounted over magnetic wheels 110 from an inside of protective fender(s) 120; in FIGS. 2-4, magnetic field sensor(s) 150 are mounted on an axle support 152 of chassis 104 for a respective wheel; and in FIG. 5, magnetic field sensors 150 are mounted in some other fashion on chassis 104, e.g., brackets (not shown). In any event, each magnetic field sensor 150 is positioned radially outward a circumference 154 of magnetic wheel 110 and typically axially centered, e.g., at a distance (d) to achieve uniform magnetic field measurements.

Monitoring system 130 may also include a monitoring controller 170 that can carry out various functions based on stray field portion 144 measurements by magnetic field sensor(s) 150. Monitoring controller 170 can be calibrated based on total magnetic field 140 so that it can discern stray field portion 144 apart from magnetic field 140 emitting from non-contacting part of wheel 110 (upper cross-section in FIG. 2), i.e., it can remove total magnetic field 140 from the measurement to identify just stray field portion 144. Ideally, magnetic field sensor 150 is as close as possible to magnetic wheel 110 to ensure accuracy. However, in some cases, shown only in FIG. 4 for clarity, measurement of stray field portion 144 by magnetic field sensor(s) 150 may require a biasing magnet 160 proximate a location of magnetic field sensor 150 to counterbalance the strength of total magnetic field 140 from magnetic wheel 110 which can overwhelm or saturate certain magnetic field sensors 150. That is, biasing magnet 160 may compensate for the bias of total magnetic field 140 by reducing stray field portion 144 by creating a counterbalancing magnetic field. Biasing magnet 160 may include any now known or later developed permanent magnet, or selectively operable electromagnet.

In one embodiment, monitoring controller 170 identifies (or determines) a change in a magnetic adhesion force F of magnetic wheel 110 to ferromagnetic structure 102 based on a change in the measured stray field portion 144 of total magnetic field 140. Total magnetic field 140 created by magnetic wheel 110 is ideally substantially constant in magnitude. However, the distribution of total magnetic field 140 between adhering field portion 142 and stray field portion 144 can vary depending on the interaction of adhering field portion 142 with ferromagnetic structure 102. Consequently, changes in stray field portion 144 indicate changes in adhering field portion 142 which also indicate changes in magnetic adhesive force F. Changes in stray field portion 144 can be created in a wide variety of ways. As noted above, stray field portion 144 and magnetic adhesion force F can change when ferromagnetic structure 102 upon which robot 100 is traveling changes. For example, ferromagnetic structure 102 may be inconsistent in terms of body 106 thickness, coating 108 thickness, surface smoothness, surface contamination or material looseness, or cracking in any part thereof. Further, ferromagnetic structure 102 may have joints (e.g., welds) or edges or corners that impact field portions 142, 144. Stray field portion 144 can also change when contaminants are present on a portion of a circumference 154 (i.e., outer surface) of magnetic wheel 110.

Figure 6:
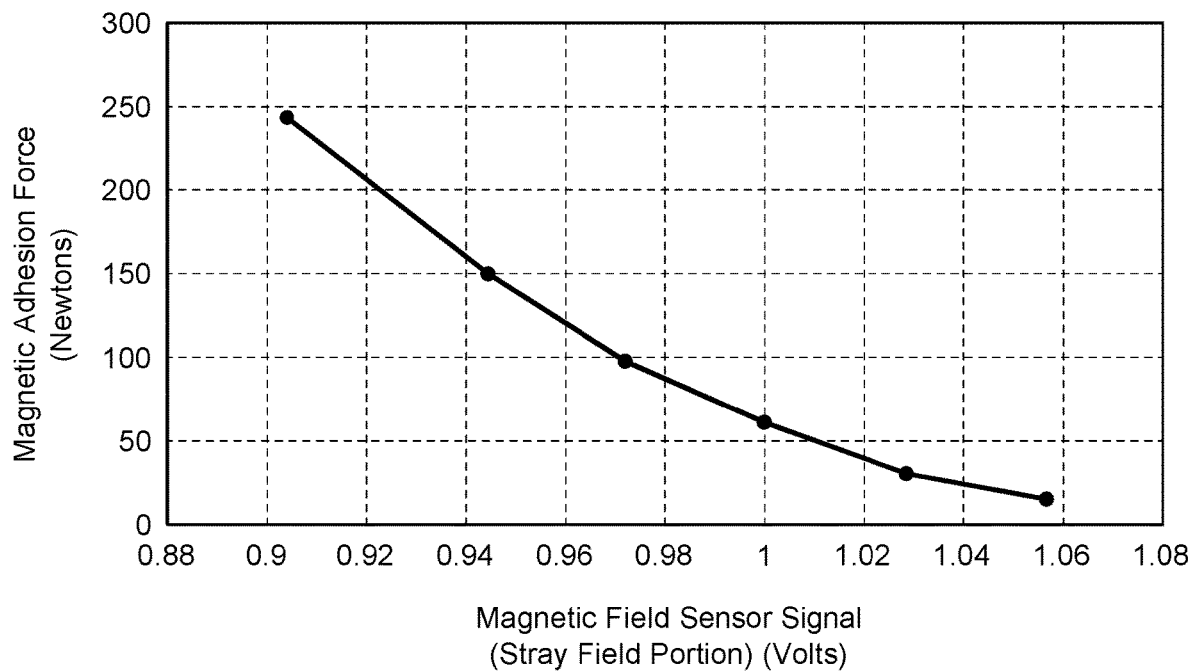
FIG. 6 shows a graph illustrating an empirical model of a stray field portion measurement of a stray field portion versus magnetic adhesion force according to embodiments of the disclosure.
Figure 7:
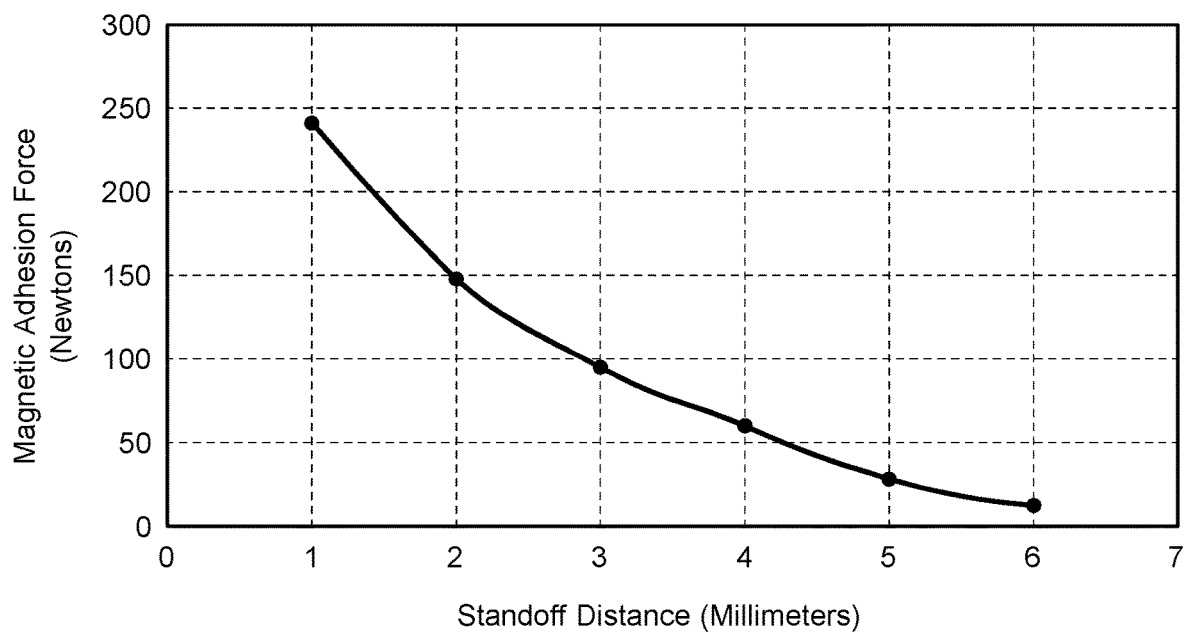
FIG. 7 shows a graph illustrating variation in a stray field portion measurement of a total magnetic field versus standoff distance from a ferromagnetic body according to embodiments of the disclosure.

Monitoring controller 170 can be configured to determine an actual magnetic adhesion force F of magnetic wheel(s) 110 to ferromagnetic structure 102 based, for example, on an empirical model representing stray field portion 144 versus magnetic adhesion force F. FIG. 6 shows an example empirical model including stray field portion 144 level, e.g., in Volts as measured by magnetic field sensor(s) 150, versus magnetic adhesion force F for a particular ferromagnetic body 106. As understood, the closer magnetic wheel 110 is to ferromagnetic body 106, the more magnetic adhesion force F that can exist. An empirical model can be formed for different coating 108 thicknesses that create different standoff distances D, including a no coating situation (FIG. 4). In any event, the empirical model (see FIG. 6) represents stray field portion 144 level, e.g., in Volts as measured by magnetic field sensor(s) 150, versus magnetic adhesion force F. As shown best in FIGS. 2 and 5, where coating 108 is present on ferromagnetic structure 102, an empirical model can be formed for different coating 108 thicknesses that create different standoff distances D, e.g., 1 mm, 3 mm, 6 mm, etc. FIG. 7 shows an example graph illustrating the impact of standoff distance D (millimeters) to magnetic adhesion force F strength (Newtons). As shown, magnetic adhesion force F increases with lower thicknesses because more of total magnetic field 140 is attracted into ferromagnetic structure 102 with thinner coatings 108. Again, FIG. 6 shows an empirical model that may be created by measuring stray field portion 144 versus magnetic adhesion force F for a given ferromagnetic body 106 thickness. The empirical model can be used to determine an actual magnetic adhesion force F base on stray field portion 144 measurement. While the disclosure has been described as employing an empirical model, it is understood that algorithmic models may also be employed using any now known or later developed mathematical techniques, e.g., machine learning, artificial intelligence, etc.

During movement of robot 100 over a flat ferromagnetic structure 102, and assuming among other factors that ferromagnetic structure 102 is consistent in body 106 thickness, coating 108 thickness, etc., each field portion 142, 144 should remain constant in magnitude, indicating a constant magnetic adhesive force F of magnetic wheel 110 with ferromagnetic structure 102. In contrast, a change in stray field portion 144, as measured by magnetic field sensor(s) 150, indicates a change in the magnitude of adhering field portion 142, and hence a change in magnetic adhesive force F of one or more magnetic wheel(s) 110. Most notably, an increase in stray field portion 144 indicates a reduction in the magnetic adhesion force F, i.e., because more of total magnetic field 140 is not used as adhering field portion 142 and is not being attracted by ferromagnetic structure 102 as stray field portion 144. An increase in stray field portion 144 thus can indicate an unsafe condition in which magnetic wheel(s) 110 may lose sufficient magnetic adhesive force F to maintain robot 100 adhered to ferromagnetic structure 102. In this setting, monitoring controller 170 may determine whether magnetic adhesion force F is outside of a safe operating level for robot 100, e.g., as indicated by stray field portion 144 level exceeding a safe level, or by magnetic adhesion force F (derived from the empirical model) not meeting a safe level. In response to magnetic adhesion force F being outside the safe operating level, monitoring controller 170 can create an unsafe signal, e.g., for motor controller 114 of robot 100. In one embodiment, monitoring controller 170 and/or motor controller 114 can take any of a variety of precautions to avoid a disconnection of robot 100 and ferromagnetic structure 102 such as but not limited to: sounding an alarm for a user to take action, stopping movement of robot 100, and/or automatically reversing a direction of robot 100. As understood, robot 100 can communicate an alarm either at robot 100 or at a conventional remote control 172 (FIG. 1), if used.

Monitoring controller 170 can also be configured to detect an obstacle in a path of the magnetic wheel 110, e.g., for a particular ferromagnetic structure 102. For example, monitoring controller 170 can be calibrated for a typical condition of ferromagnetic structure 102, e.g., typical area with no contaminants, joints, corners, etc. Based on the calibration, the level of changes in stray field portion 144 that do not amount to an unsafe condition can be matched to certain conditions. For example, a 'normal' operating condition for stray field portion 144 may measure 18 milli-Tesla (mT), and an unsafe level may be 21 mT. In between those magnetic magnitudes, an increase in stray field portion 144 magnitude of 1-2 mT may indicate the presence of a joint, like a weld, while an increase in magnitude of 2-3.5 mT may indicate robot 100 is at or approaching an edge or other obstacle in ferromagnetic structure 102. As used herein, "obstacle" can include any change from nominal conditions of ferromagnetic structure 102 such as but not limited to: a thickness change of a non-magnetic coating 108, e.g., on the ferromagnetic structure; structure changes like welds, edges or corners; presence of non-ferromagnetic material, e.g., austenitic welds or glass/epoxy repair patches; and/or changes of the underlying ferromagnetic body 106 material, e.g., a thinner region therein. Monitoring controller 170 can also be configured to detect contamination on magnetic wheel(s) 110 based on stray field portion 144. For example, during operation of robot 100, an increase in magnitude of 0.2-1 mT may indicate contamination, e.g., accumulation of particles, debris, loose parts, dust, portions of coating 108, etc., on magnetic wheel 110, i.e., on circumference 154 thereof, that reduce the magnetic adhesion force. Monitoring controller 170 may also make this determination prior to or after use based on, for example, stray field portion 144 measurement apart from ferromagnetic structure 102 not meeting an expected value, indicating contamination on the wheel.

Figure 5:
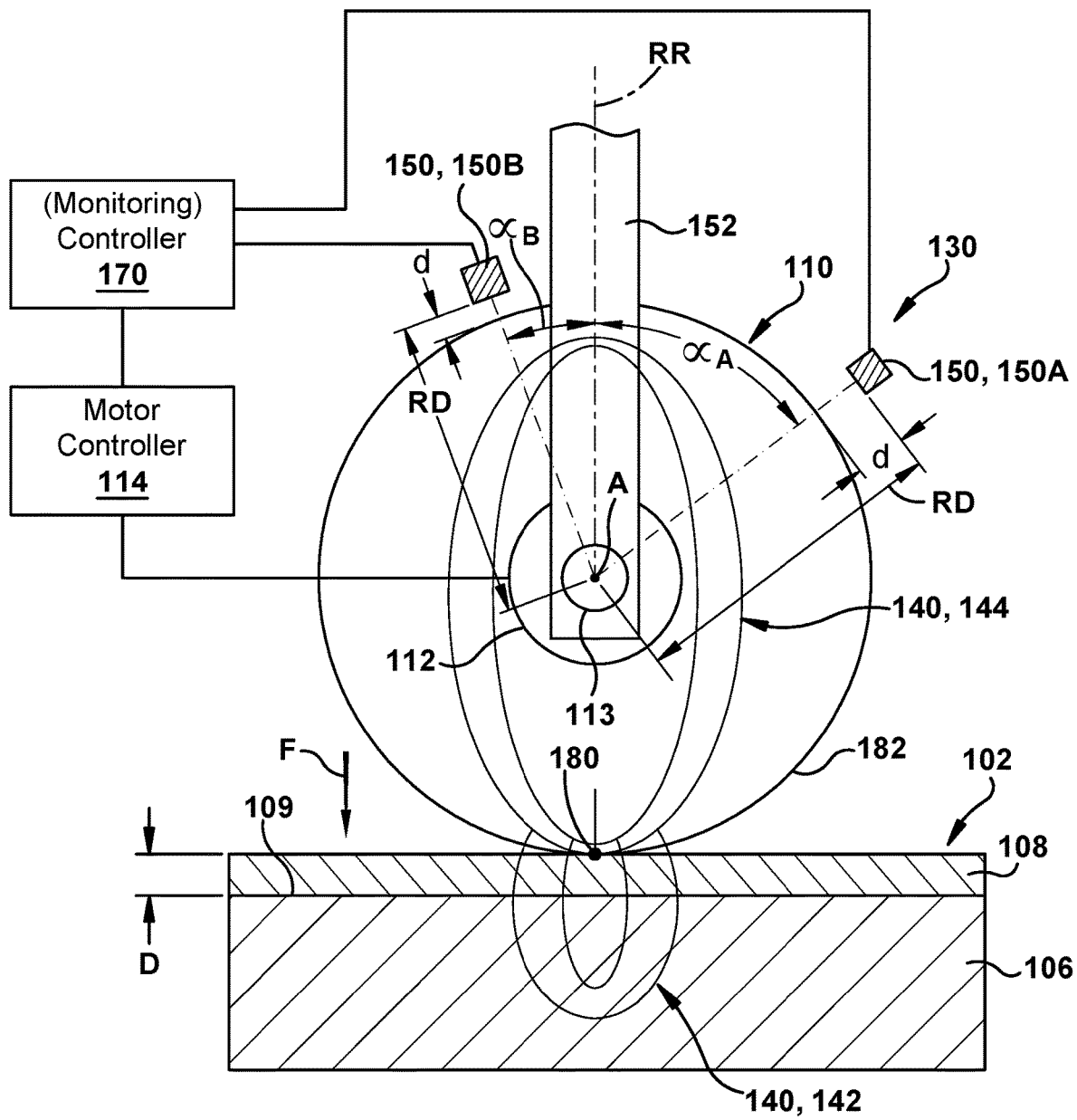
FIG. 5 shows a schematic side view of a magnetic wheel with two magnetic field sensors of a monitoring system according to embodiments of the disclosure.

Referring to FIG. 5, magnetic field sensor(s) 150 may include a plurality of magnetic field sensors 150A, 150B positioned about a respective magnetic wheel 110, each magnetic field sensor 150A, 150B measuring stray field portion 144 of total magnetic field 140 about magnetic wheel 110 that is redirected by ferromagnetic structure 102. Monitoring system 130 may include a first magnetic field sensor 150A at a first predefined angle αA relative to a fixed reference radius of an axis A of magnetic wheel 110, i.e., as measured from fixed reference radius RR. Fixed reference radius RR is set at a fixed circumferential point on axis A of magnetic wheel 110, i.e., through a preset cross-section of axis A. While fixed reference radius RR is shown vertically oriented from axis A, i.e., diametrically opposed to known contact point 180 of magnetic wheel 110, it can be shifted as desired. Further, monitoring system 130 may include a second magnetic field sensor 150B at a second predefined angle αB relative fixed reference radius R of axis A of magnetic wheel 110, i.e., as measured from the same fixed reference radius RR. As illustrated, first and second magnetic field sensors 150A, 150B have the same radial distance (RD) from axis A of magnetic wheel 110, i.e., same distance (d) from circumference 154 of the wheel, as during creation of the empirical model shown in FIG. 8. However, this may not be necessary if a calibration allows for compensation for different radial distances. First predefined angle αA is different than second predefined angle αB, which gives each magnetic field sensor 150A, 150B a different perspective when measuring stray field portion 144. In FIG. 5, magnetic field sensor 150A is at about +45°, and magnetic field sensor 150B is at about −30°. Magnetic field sensors 150A, 150B can be positioned at any different angular positions. In one example, shown in FIG. 5, one sensor 150A is over a circumferentially forward portion of magnetic wheel 110 (i.e., to one side of the top of magnetic wheel while on a horizontal surface), and the other sensor 150B is over a circumferentially rearward portion of magnetic wheel 110 (i.e., to the opposing side of the top of magnetic wheel while on a horizontal surface). While two magnetic field sensors 150 are shown, any number can be employed for each wheel.

Figure 8:
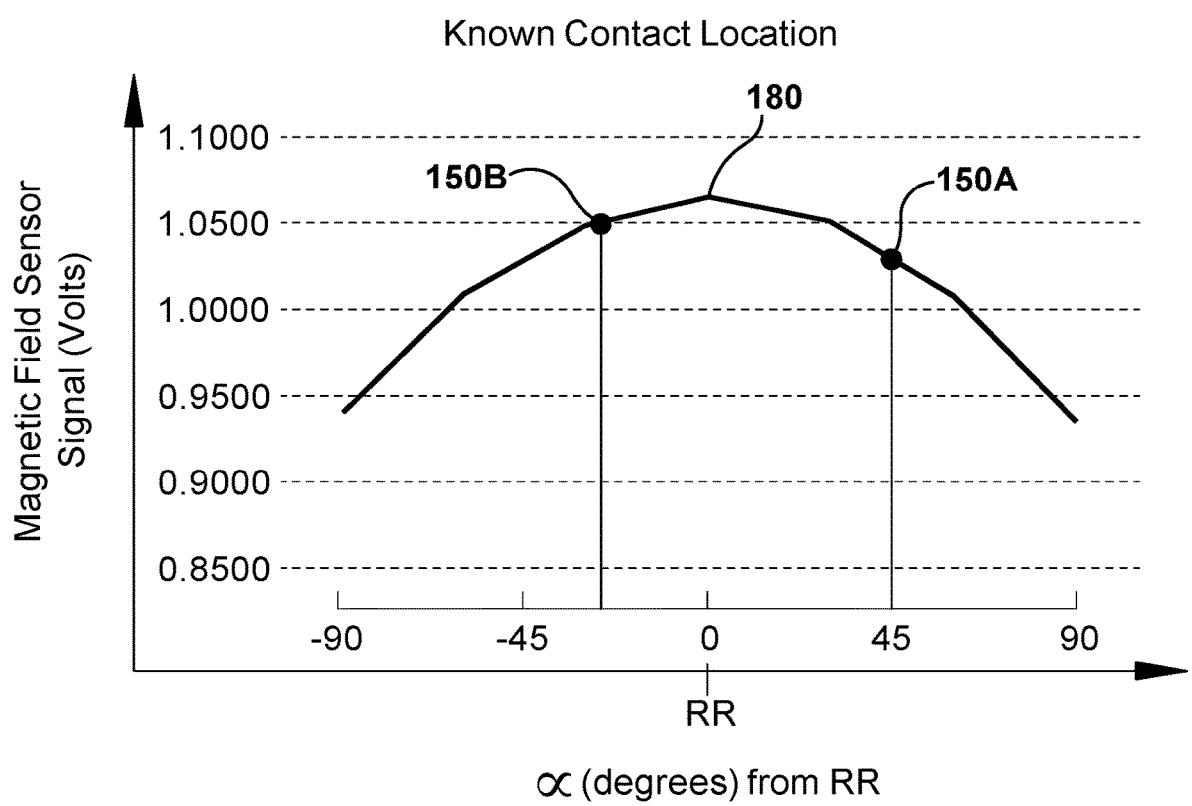
FIG. 8 shows a graph illustrating an empirical model of stray field portion measurements relative to an angle of the magnetic field sensor to a fixed reference radius on an axis of the magnetic wheel at a known contact point of the wheel to a ferromagnetic structure, according to embodiments of the disclosure.

In another embodiment, monitoring controller 170 (FIGS. 2-5) can further determine an angular contact point of magnetic wheel 110 with ferromagnetic structure 102 relative to axis A of magnetic wheel 110 based on an empirical model. With reference to FIGS. 4 and 8, a method to generate the empirical model will be described. As shown in FIG. 4, with magnetic wheel 110 magnetically adhered to ferromagnetic structure 102 in a stationary position having a known contact point 180 of magnetic wheel 110 with ferromagnetic structure 102, stray field portion 144 may be measured by magnetic field sensor 150 over a range of angles (a) of magnetic field sensor 150 about axis A of magnetic wheel 110. For example, as shown by the semi-circular arc in FIG. 4, magnetic field sensor 150 may be moved about axis A of magnetic wheel 110 to a number of angular locations a (relative to a fixed reference radius RR, e.g., over 180°) at which stray field portion 144 (FIG. 1) is measured. Magnetic field sensor 150 has a constant radial distance (RD) from axis A of magnetic wheel 110, i.e., same distance (d) from circumference 154 of the wheel during the stray field portion measurements, or a calibration may be provided to compensate for a different radial distance. The number of angular positions at which measurements are taken can be user selected. FIG. 8 shows the empirical model created by the measurements that illustrates the relationship of stray field portion 144 measurements to angular position a of magnetic field sensor 150 relative to axis A of magnetic wheel 110. Each stray field portion 144 measurement is plotted versus the angular position a of magnetic field sensor 150, e.g., from −90° to +90°. It will be recognized that various models for each standoff distance D of magnetic wheel 110 from ferromagnetic structure 102 can be created in a similar fashion. In one example, the empirical model of FIG. 8 represents stray field portion 144 measurements for known contact point 180 of FIG. 4 with the contact point at a diametrical bottom of magnetic wheel 110 denoted as angle 0° in FIG. 8. Known contact point location 180 is shown at the peak of the curve, indicating contact point is at 180° from fixed reference radius RR. (It is noted that angle reference a is shown in the figures with fixed reference radius RR extending vertically from axis A—the angular reference values can change for different fixed reference radius RR.)

Referring again to FIGS. 5 and 8, during movement of magnetic wheel 110 over ferromagnetic structure 102 while magnetically adhered thereto, monitoring controller 170 can determine (current) contact point 182 of magnetic wheel 110 by: first measuring stray field portion 144 of total magnetic field 140 with first magnetic field sensor 150A at first predefined angle αA relative to fixed reference radius RR on axis A of magnetic wheel 110, and second measuring stray field portion 144 of total magnetic field 140 with second magnetic field sensor 150B at second predefined angle αB relative to fixed reference radius RR on axis A of magnetic wheel 110. FIG. 8 shows illustrative stray field portion 144 measurements by magnetic field sensor 150A and 150B plotted relative to an angle from fixed reference radius RR, which is diametrically aligned with known contact point 180 in the FIG. 5 example. Monitoring controller 170 can use the empirical model to calculate the current contact point 182 (in phantom in FIG. 5) of magnetic wheel 110 with ferromagnetic structure 102 using the first and second stray field portion measurements. For example, when on the curve in FIG. 8, the peak value of 1.07 V represents a magnetic field sensor 150 reading for known contact point 180 when the magnetic field sensor (used to make model) is diametrically aligned (e.g., directly vertically over) known contact point 180 in FIG. 4, and with fixed reference radius RR aligned therewith at a 0° point on the graph. From this curve, the current contact point 182 can be calculated using two magnetic field sensors 150A, 150B whose angular position relative to fixed reference radius RR is known. For example, assume first magnetic field sensor 150A is angled at +45° from fixed reference radius RR (FIG. 5), and second magnetic field sensor 150B is angled at −30° from fixed reference radius RR (FIG. 5). In this case, as shown in FIG. 8, sensor 150B should measure about 1.05 V and sensor 150A should measure about 1.03V commensurate with their angular location on the empirical model. Where magnetic wheel 110 moves along a curved surface to new contact point 182, one magnetic field sensor 150A may measure about 0.93 V while the other magnetic field sensor 150B measures again 1.05 V, indicating that contact point 182 is now much closer to first magnetic field sensor 150A. Based on the magnetic field measurements, monitoring controller 170 can determine the extent of the angular shift relative fixed reference radius RR, and the new location of contact point 182. In the example shown structurally in FIG. 5 as an angled ferromagnetic structure surface (in phantom) and empirically in FIG. 8, current contact point 182 is at about +135° from fixed reference radius RR. In an alternative embodiment, monitoring controller 170 could use more than two stray field portion measurements, e.g., from three magnetic field sensors 150, to increase accuracy. For example, using more than two magnetic sensor measurements increases accuracy by allowing for distinction of contact point 182 movement from other reasons of flux density changes, e.g., by removing any irregularities in the measurements.

Embodiments of the disclosure can also include robot 100, i.e., magnetic crawler robot including monitoring system 130 thereon. Monitoring controller 170 can include any now known or later developed computerized industrial controller capable of carrying out the functions described herein, e.g., in hardware and/or software. It is understood that motor controller 114 and/or monitoring controller 170 need not be coupled with robot 100, e.g., on chassis 104, but can be in any remote location and operatively coupled to robot 100, e.g., using a wire or wirelessly. User information from any part of robot 100 can be communicated to a user in any now known or later developed fashion, e.g., remote control interface like a display.

While monitoring controller 170 and motor controller 114 have been illustrated as separate components, it is emphasized that the teachings of the disclosure can be implemented in a single controller, e.g., software for implementing the disclosure can be incorporated in a currently used motor controller.

Embodiments of the disclosure provide a technical effect in better reliability of systems/vehicles based on magnetic adhesion force, leading to less accidental detachments and avoidance of other failures.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A magnetic adhesion force monitoring system, comprising:
a magnetic field sensor measuring a stray field portion of a total magnetic field emitted by a magnetic wheel that is magnetically adhered to a ferromagnetic structure, the magnetic wheel being on a robot, the stray field portion including a portion of the total magnetic field redirected by the ferromagnetic structure; and
a controller determining a change in a magnetic adhesion force of the magnetic wheel to the ferromagnetic structure based on a change in the measured stray field portion of the total magnetic field,
wherein the magnetic field sensor includes a first magnetic field sensor at a first predefined angle relative to an axis of the magnetic wheel, and a second magnetic field sensor at a second predefined angle relative to the axis of the magnetic wheel, wherein the first predefined angle is different than the second predefined angle; and
wherein the controller further determines an angular contact point of the magnetic wheel with the ferromagnetic structure relative to the axis of the magnetic wheel while in motion based on an empirical model representing a relation of a known contact point of the magnetic wheel and the ferromagnetic structure, and respective first and second stray field portion measurements with the first and second magnetic field sensors while in motion.

2. The system of claim 1, wherein an increase in the stray field portion indicates a reduction in the magnetic adhesion force.

3. The system of claim 1, further comprising a biasing magnet proximate a location of the magnetic field sensor to reduce the stray field portion toward the magnetic field sensor.

4. The system of claim 1, wherein the robot is a magnetic crawler robot.

5. The system of claim 4, wherein the magnetic field sensor includes a plurality of magnetic field sensors positioned about the magnetic wheel, each magnetic field sensor measuring the stray field portion of the total magnetic field about the magnetic wheel that is redirected by the ferromagnetic structure.

6. The system of claim 4, wherein the magnetic crawler robot includes a plurality of magnetic wheels, each magnetic wheel including at least one magnetic field sensor positioned thereabout to measure the stray field portion of the total magnetic field about the respective magnetic wheel that is redirected by the ferromagnetic structure.

7. The system of claim 4, wherein the controller is further configured to detect an obstacle in a path of the magnetic wheel based on the measured stray field portion.

8. The system of claim 4, wherein the controller is further configured to detect contamination on the magnetic wheel based on the magnetic adhesion force.

9. The system of claim 4, wherein the controller is further configured to:
- determine whether the magnetic adhesion force is outside of a safe operating level for the magnetic crawler robot; and
- in response to the magnetic adhesion force being outside the safe operating level, create an unsafe signal for a motor controller of the magnetic crawler robot.

10. The system of claim 4, wherein the magnetic field sensor is radially outward of a circumference of the magnetic wheel.

11. The system of claim 4, wherein the controller further determines the magnetic adhesion force of the magnetic wheel to the ferromagnetic structure based on an empirical model representing the stray field portion versus the magnetic adhesion force.

12. The system of claim 11, wherein the ferromagnetic structure includes a ferromagnetic body and a coating thereon, and the empirical model is created by measuring the stray field portion versus the magnetic adhesion force over a range of coating thicknesses for a given ferromagnetic body thickness.

13. A magnetic crawler robot, comprising:
- a chassis having a plurality of magnetic wheels thereon, each magnetic wheel configured to magnetically adhere the chassis to a ferromagnetic structure;
- a magnetic field sensor measuring a stray field portion of a total magnetic field emitted by at least one selected magnetic wheel, the stray field portion including a portion of the total magnetic field redirected by the ferromagnetic structure; and
- a controller determining a change in a magnetic adhesion force of the magnetic wheel to the ferromagnetic structure based on a change in the measured stray field portion of the total magnetic field,
- wherein the magnetic field sensor includes a first magnetic field sensor at a first predefined angle relative to an axis of the magnetic wheel, and a second magnetic field sensor at a second predefined angle relative to the axis of the magnetic wheel, wherein the first predefined angle is different than the second predefined angle; and
- wherein the controller further determines an angular contact point of the magnetic wheel with the ferromagnetic structure relative to the axis of the magnetic wheel while in motion based on an empirical model representing a relation of a known contact point of the magnetic wheel and the ferromagnetic structure, and respective first and second stray field portion measurements with the first and second magnetic field sensors while in motion.

14. The magnetic crawler robot of claim 13, further comprising a motor controller to control at least one motor on the chassis that is configured to drive at least one of the plurality of magnetic wheels.

15. The magnetic crawler robot of claim 14, wherein the controller is configured to:
- determine whether the magnetic adhesion force is outside of a safe operating level for the magnetic crawler robot; and
- in response to the magnetic adhesion force being outside the safe operating level, create an unsafe signal for the motor controller of the magnetic crawler robot.

16. A method, comprising:
- measuring a stray field portion of a total magnetic field emitted by a magnetic wheel while the magnetic wheel is magnetically adhered to a ferromagnetic structure, the stray field portion including a portion of the total magnetic field redirected by the ferromagnetic structure; and
- identifying a change in a magnetic adhesion force of the magnetic wheel to the ferromagnetic structure based on a change in the measured stray field portion of the total magnetic field,
- wherein the measuring includes measuring using a magnetic field sensor includes a first magnetic field sensor at a first predefined angle relative to an axis of the magnetic wheel, and a second magnetic field sensor at a second predefined angle relative to the axis of the magnetic wheel, wherein the first predefined angle is different than the second predefined angle; and
- wherein the identifying includes determining using a controller that further determines an angular contact point of the magnetic wheel with the ferromagnetic structure relative to the axis of the magnetic wheel while in motion based on an empirical model representing a relation of a known contact point of the magnetic wheel and the ferromagnetic structure, and respective first and second stray field portion measurements with the first and second magnetic field sensors while in motion.

17. The method of claim 16, further comprising determining the magnetic adhesion force of the magnetic wheel to the ferromagnetic structure based on an empirical model representing the stray field portion versus the magnetic adhesion force.

18. The method of claim 17, wherein the ferromagnetic structure includes a ferromagnetic body and a coating thereon, and
- further comprising creating the empirical model by measuring the stray field portion versus the magnetic adhesion force over a range of coating thicknesses for a given ferromagnetic body thickness.

19. The method of claim 16, further comprising determining an angular contact point of the magnetic wheel with the ferromagnetic structure relative to an axis of the magnetic wheel, the determining of the angular contact point including:
- with the magnetic wheel magnetically adhered to the ferromagnetic structure in a stationary position having a known contact point of the magnetic wheel with the ferromagnetic structure, measuring the stray field portion over a range of angles of the magnetic field sensor about the axis of the magnetic wheel, to create an empirical model of the stray field portion measurements to angular position of the magnetic field sensor relative to the axis of the magnetic wheel;
- during movement of the magnetic wheel over the ferromagnetic structure while magnetically adhered thereto, determining the contact point of the wheel by:
  - first measuring the stray field portion of the total magnetic field with a first magnetic field sensor at a first predefined angle relative to a fixed reference radius of the axis of the magnetic wheel,
  - second measuring the stray field portion of the total magnetic field with a second magnetic field sensor at a second predefined angle relative to the fixed reference radius of the axis of the magnetic wheel, and
  - using the empirical model to calculate the contact point of the magnetic wheel with the ferromagnetic structure using the first and second stray field portion measurements.

* * * * *